(12) United States Patent  
Watanabe

(10) Patent No.: US 9,667,029 B2  
(45) Date of Patent: May 30, 2017

(54) SEMICONDUCTOR LASER LIGHT SOURCE

(71) Applicant: MITSUBISHI ELECTRIC CORPORATION, Tokyo (JP)

(72) Inventor: Hiroyuki Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/028,488

(22) PCT Filed: Jun. 25, 2014

(86) PCT No.: PCT/JP2014/003398  
§ 371 (c)(1),  
(2) Date: Apr. 11, 2016

(87) PCT Pub. No.: WO2015/063973  
PCT Pub. Date: May 7, 2015

(65) Prior Publication Data  
US 2016/0254639 A1    Sep. 1, 2016

(30) Foreign Application Priority Data  
Nov. 1, 2013    (JP) ................................ 2013-228387

(51) Int. Cl.  
*H01S 5/02*    (2006.01)  
*H01S 5/024*    (2006.01)  
(Continued)

(52) U.S. Cl.  
CPC .......... *H01S 5/024* (2013.01); *H01S 5/02236* (2013.01); *H01S 5/02469* (2013.01);  
(Continued)

(58) Field of Classification Search  
None  
See application file for complete search history.

(56) References Cited

U.S. PATENT DOCUMENTS

| 2004/0252735 | A1 | 12/2004 | Sakano et al. | |
| 2008/0192206 | A1* | 8/2008 | Takagi | G09G 3/02 353/28 |
| 2009/0104727 | A1* | 4/2009 | Krejci | H01S 5/4031 438/46 |

FOREIGN PATENT DOCUMENTS

| JP | 6-112596 A | 4/1994 |
| JP | 2001-284729 A | 10/2001 |

(Continued)

*Primary Examiner* — Armando Rodriguez  
(74) *Attorney, Agent, or Firm* — Birch, Stewart, Kolasch & Birch, LLP

(57) ABSTRACT

In conventional semiconductor laser light sources, since intervals of light emitter waveguides are changed or stresses which are applied on chips of a laser array are controlled in the production process, there exists a problem that the productivity is lowered. A structure of a heat sink 3a, on which a semiconductor laser array 2 is mounted in which a plurality of semiconductor lasers are arrayed at equal intervals in a stripe width direction, is configured so that the heat radiation efficiencies of the plurality of semiconductor lasers are not constant between the central region and other regions in the stripe width direction. Concretely, the heat sink is configured in such a way that an area of a second region in a second surface of the heat sink is smaller than an area of a fourth region in the second surface with which the semiconductor laser radiation portion except for the central side of the plurality of semiconductor lasers in the stripe width direction are in contact, when each of the areas is converted into an area per semiconductor laser.

2 Claims, 5 Drawing Sheets

(51) Int. Cl.
*H01S 5/022* (2006.01)
*H01S 5/40* (2006.01)
(52) U.S. Cl.
CPC .......... *H01S 5/4025* (2013.01); *H01S 5/4087* (2013.01); *H01S 5/02415* (2013.01); *H01S 5/02461* (2013.01)

(56) References Cited

FOREIGN PATENT DOCUMENTS

| JP | 2005-5511 A | 1/2005 |
|----|-------------|--------|
| JP | 2008-4743 A | 1/2008 |
| JP | 2008-198759 A | 8/2008 |
| JP | 2009-111230 A | 5/2009 |
| JP | 2009-152277 A | 7/2009 |

* cited by examiner

SEMICONDUCTOR LASER LIGHT SOURCE

TECHNICAL FIELD

The present invention relates to a semiconductor laser light source.

BACKGROUND ART

A semiconductor light emission element such as a semiconductor laser or a light emitting diode has been used as a light source for illumination devices or display devices instead of a lamp whose life time is short. The laser light source whose light emission area is small, whose light output can be easily synthesized, and whose monochromaticity can provide the wide color gamut is considered promising in particular as a high power light source. However, when the laser is used as the light source, a phenomenon specific to the laser appears which looks like glare of flecks called speckle noise.

Hence, in a conventional semiconductor laser light source, the interval of adjacent waveguides arrayed in the central portion of a plurality of waveguides constituting a semiconductor laser array is designed to be narrower than the interval of adjacent waveguides arrayed in end portions (for example, refer to Patent Document 1). Moreover, since another conventional semiconductor laser light source is configured so as to have a stress distribution whose stress is different in the arrayed direction of the laser emission end faces in a semiconductor laser array, the wavelength width of the light emitted from the semiconductor laser light source becomes broad, and therefore speckle noise has been reduced (for example, refer to Patent Document 2).

PRIOR ART DOCUMENT

Patent Document

Patent Document 1: Japanese Patent Laid-Open Publication No. 2008-4743
Patent Document 2: Japanese Patent Laid-Open Publication No. 2009-111230

SUMMARY OF THE INVENTION

Problems to be Solved by the Invention

However, in the conventional semiconductor laser light source, there exists a problem that the productivity is lowered in the manufacturing process because each interval between the waveguides is changed or each stress applied on chips in the laser array is controlled.

The present invention is made in order to solve the above-described problems, and an objective is to provide a semiconductor laser light source whose decrease in productivity is suppressed and whose speckle noise can be reduced.

Means to Solve the Problem

A semiconductor laser light source according to the present invention includes a semiconductor laser array in which a plurality of semiconductor lasers are provided and stripes of the plurality of semiconductor lasers are arrayed at equal intervals in a stripe width direction, and includes a heat sink having a first surface on which the semiconductor laser array is mounted, and a second surface opposite to the first surface and in contact with a cooling unit, wherein an area of a second region in the second surface opposite to a first region in the first surface with which a semiconductor laser radiation portion in the central side of the plurality of semiconductor lasers in the stripe width direction is in contact, is smaller than an area of a fourth region in the second surface opposite to a third region in the first surface with which a semiconductor laser radiation portion except for lasers in the central side of the plurality of semiconductor lasers in the stripe width direction is in contact, when each of the areas is converted into an area per semiconductor laser.

An another semiconductor laser light source according to the present invention includes a semiconductor laser array in which a plurality of semiconductor lasers are provided and stripes of the plurality of semiconductor lasers are arrayed at equal intervals in a stripe width direction, and includes a heat sink having a third surface on which the semiconductor laser array is mounted, and a fourth surface opposite to the third surface and in contact with a cooling unit, wherein a material of a second portion corresponding to a sixth region with which a semiconductor laser radiation portion except for lasers in the central side is in contact, has higher thermal conductivity than a material of a first portion corresponding to a fifth region with which a semiconductor laser radiation portion in the central side of the plurality of semiconductor lasers in the stripe width direction is in contact.

Effects of the Invention

According to the present invention, a semiconductor laser light source whose decrease in productivity is suppressed and whose speckle noise can be reduced is obtained.

EMBODIMENTS FOR CARRYING OUT THE INVENTION

Embodiment 1

Figure 1:
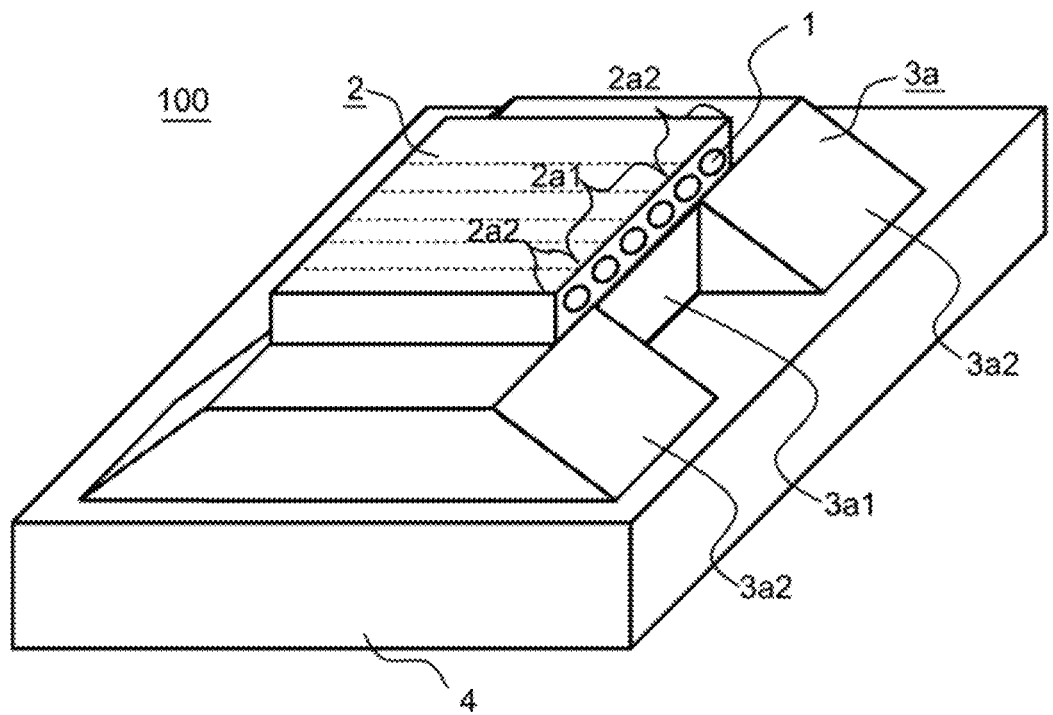
FIG. 1 is a diagram showing a structure of a semiconductor laser light source according to Embodiment 1 of the present invention.

FIG. 1 is a structure diagram of a semiconductor laser light source 100 according to Embodiment 1 of the present invention. A semiconductor laser array 2 includes a plurality of semiconductor lasers and stripes (not illustrated) of the plurality of semiconductor lasers are arrayed at equal intervals in the stripe width direction. On the end face of the semiconductor laser array 2, an emission end face 1 of laser light is provided corresponding to each of the semiconductor lasers. A heat sink 3a has a first surface on which the semiconductor laser array 2 is mounted and a second surface opposite to the first surface. The semiconductor laser array 2 is designed to radiate heat generated in each semiconductor laser by contact of each semiconductor laser radiation portion with the first surface of the heat sink 3a. A cooling unit 4 that cools the heat sink 3a is joined with the second surface of the heat sink 3a. Here, while the stripe that emits light when an electric current is supplied to the semiconductor laser array 2 and a stripe-shaped electrode for supplying the current to the stripe are not illustrated, the lateral direction in FIG. 1 is the stripe length direction and the front-back direction in FIG. 1 is the stripe width direction.

When the electric current is supplied, each semiconductor laser constituting the semiconductor laser array 2 emits laser light from the emission end face 1, and at the same time the temperature of each semiconductor laser rises. If the temperature of each semiconductor laser constituting the semiconductor laser array 2 excessively rises, the light emitting efficiency degrades and the output of the semiconductor laser light source 100 falls down, and therefore the heat is radiated by the heat sink 3a. The heat sink 3a is made of high thermal conductivity material such as copper. The cooling unit 4 is constituted using Peltier elements, chillers or the like.

As illustrated in FIG. 1, hereinafter, semiconductor lasers in the central side in the stripe width direction illustrated in FIG. 1 among a plurality of semiconductor lasers constituting the semiconductor array 2 are referred to as a semiconductor laser group 2a1, and semiconductor lasers on both end sides, except for the semiconductor laser group 2a1, are referred to as a semiconductor laser group 2a2. Furthermore, the central side of the heat sink 3a is referred to as a first portion 3a1 and both end sides are referred to as second portions 3a2. In the heat sink 3a of the present embodiment, the radiation portion of the semiconductor laser group 2a1 is in surface contact with the first portion 3a1 located in the central side, and the radiation portions of the semiconductor laser group 2a2 are in surface contact with the second portions 3a2 located in both end sides. Moreover both the first portion 3a1 and the second portions 3a2 of the heat sink 3a are in surface contact with the cooling unit 4. Here, in the heat sink 3a, a region which is a surface of the first portion 3a1 and is in the first surface is referred to as a first region, and a region which is a surface of each of the second portions 3a2 and is in the first surface is referred to as a third region. Furthermore, a region which is a surface of the first portion 3a1 and is in the second surface is referred to as a second region, and a region which is a surface of each of the second portions 3a2 and is in the second surface is referred to as a fourth region. The heat generated in the semiconductor laser group 2a1 is radiated by surface contact with the first region of the first portion 3a1 of the heatsink 3a and is cooled by surface contact of the second region of the first portion 3a1 with the cooling unit 4. The heat generated in the semiconductor laser group 2a2 is radiated by surface contact with the third region of each of the second portions 3a2 of the sink 3a and is cooled by surface contact of the fourth region of each of the second portions 3a2 with the cooling unit 4. As it is clear in FIG. 1, in the heat sink 3a, the area of the second region is smaller than the area of the fourth region when converted into an area per semiconductor laser. Here, the conversion means dividing the area by the number of corresponding semiconductor lasers.

In other words, the heat sink 3a is configured so that the area of the second region opposite to the first region with which the radiation portion of the semiconductor laser group 2a1 is in contact is smaller than the area of the fourth region opposite to the third region with which each radiation portion of the semiconductor laser group 2a2 is in contact when converted into an area per semiconductor laser.

Incidentally, the heat generated in the semiconductor laser array 2 conducts vertically to the joined surface of the semiconductor laser array 2 and the heat sink 3a, and also conducts horizontally through the heat sink 3a. If the shape of the heat sink 3a is large enough in the heat spreading direction, the heat is efficiently radiated through the cooling unit 4. On the other hand, in the central side of the plurality of semiconductor lasers in the stripe width direction, because the contact area with the cooling unit 4 is smaller than the area in the end side, part of the heat is radiated in the air before arriving at the cooling unit 4, not through the cooling unit 4, from surfaces where the heat sink 3a is not in contact with the cooling unit 4, in the heat spreading and conducting process. Since the thermal conductivity of air is much smaller than the thermal conductivity of the heat sink 3a or the cooling unit 4, the heat radiation effect is limited. Namely the heat radiation efficiencies of the plurality of semiconductor lasers are non-uniform in the stripe width direction. As a result, the wavelength width of the semiconductor laser light source 100 is widened, and therefore the speckle noise can be reduced.

Generally, when the temperature of the semiconductor laser rises, the luminous efficiency degrades, and therefore the emission intensity becomes lower. Accordingly, there is a tendency such that the emission intensity per semiconductor laser in the semiconductor laser group 2a1 whose heat radiation efficiency becomes somewhat lower is lowered than the emission intensity per semiconductor laser in the semiconductor laser group 2a2 whose heat radiation efficiency is higher. Therefore the number of semiconductor lasers constituting the semiconductor laser group 2a1 is preferable to be larger than the number of semiconductor lasers constituting the semiconductor laser group 2a2. This can improve the non-uniformity of the wavelength width distribution shape in the semiconductor laser light source 100, and therefore the speckle noise can be further reduced.

As described above, according to the present embodiment, the semiconductor laser light source can be obtained whose decrease in productivity is suppressed and whose speckle noise can be reduced.

Figure 2:
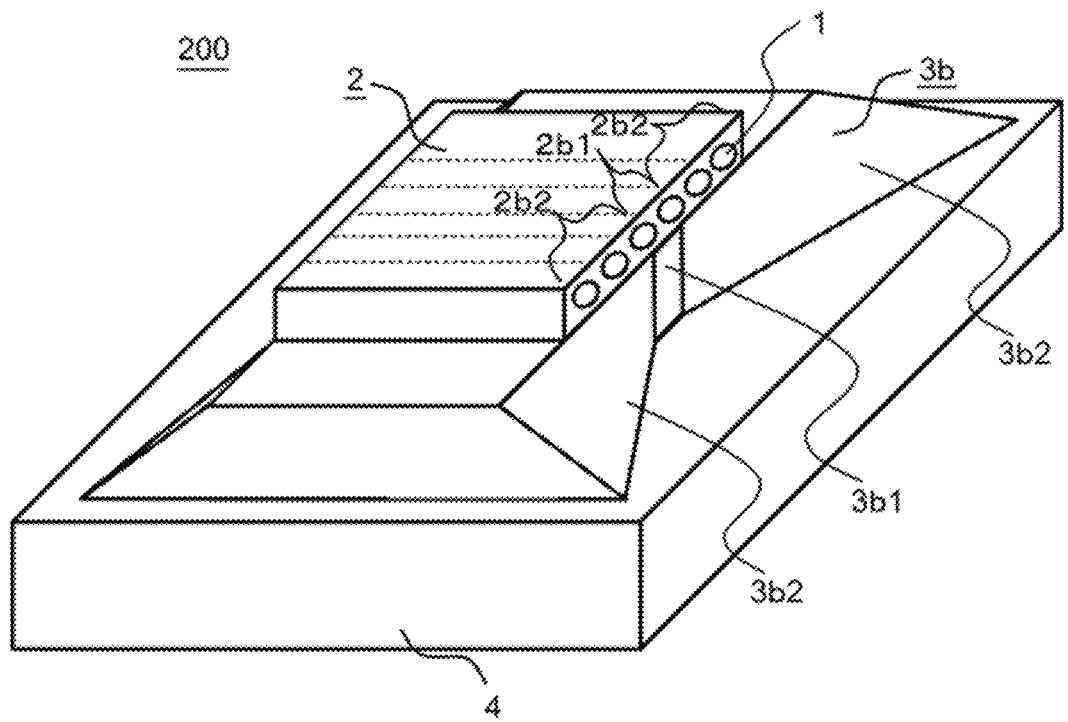
FIG. 2 is a diagram showing a structure of a modification of the semiconductor laser light source according to Embodiment 1 of the present invention.

Note that, the shape of the heat sink 3a illustrated in FIG. 1 is an example, and the shape is not limited to the shape illustrated in FIG. 1 as long as the structure is designed so that the heat radiation efficiencies of a plurality of semiconductor lasers are partially different in the stripe width direction. For example, FIG. 2 shows a semiconductor laser light source 200 as a structure modification of the semiconductor laser light source 100 according to Embodiment 1 of the present invention. Here, semiconductor lasers in the central side in the stripe width direction illustrated in FIG. 2 are referred to as a semiconductor laser group 2b1, and semiconductor lasers, on both end sides, except for the semiconductor laser group 2b1, are referred to as a semiconductor laser group 2b2. Furthermore, the central side of a heat sink 3b is referred to as a first portion 3b1 (Reference characters in the modification illustrated in FIG. 2 are different from those of FIG. 1 in order to distinguish from the example of Embodiment 1 illustrated in FIG. 1) and both end sides are referred to as second portions 3b2 (Reference characters in the modification illustrated in FIG. 2 are different from those of FIG. 1 in order to distinguish from the example of Embodiment 1 illustrated in FIG. 1). As illustrated in FIG. 2, the shape of the heat sink 3b may be the shape whose area per semiconductor laser of the fourth region included in the second surface that is a surface of each of the second portions 3b2, is gradually increased from the central side to both end sides in the stripe width direction.

Accordingly, the heat radiation efficiencies of the plurality of semiconductor lasers become non-uniform in the stripe width direction. As a result, even in the modification, the wavelength width of the semiconductor laser light source 200 is widened, and therefore the speckle noise can be similarly reduced.

Embodiment 2

Figure 3:
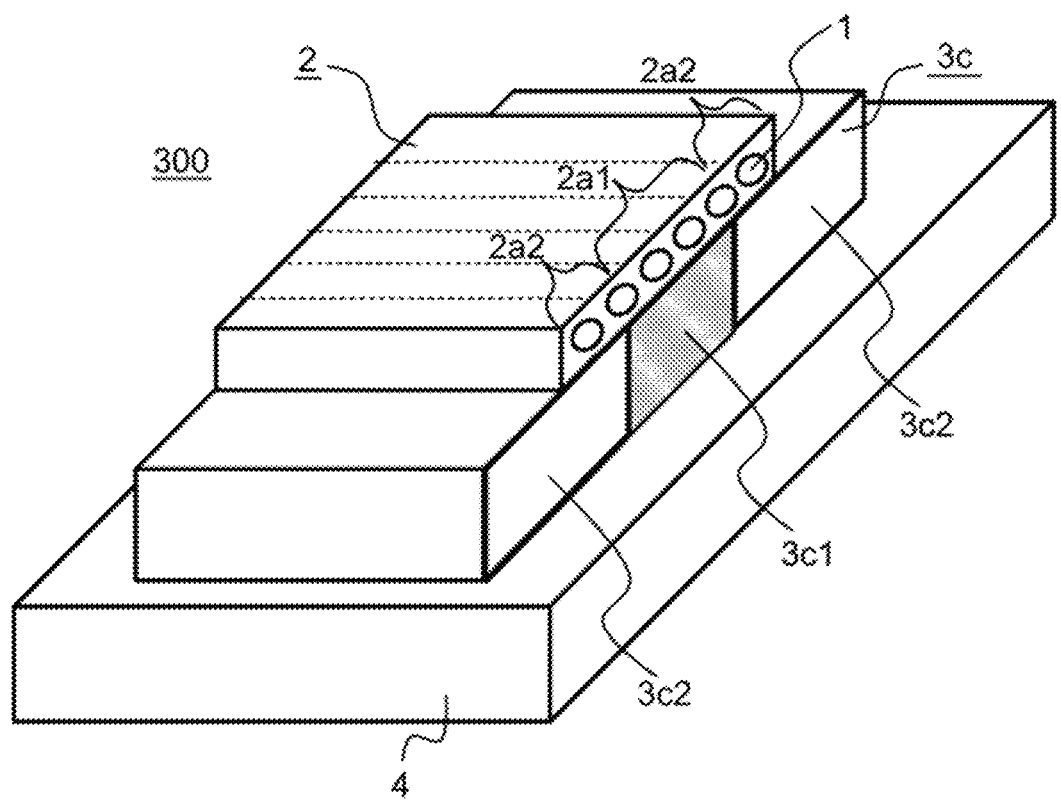
FIG. 3 is a diagram showing a structure of a semiconductor laser light source according to Embodiment 2 of the present invention.

FIG. 3 is a structural diagram of a semiconductor laser light source 300 according to Embodiment 2 of the present invention. In the present embodiment, the structure of a heat sink 3c is different from Embodiment 1, and the other components are the same as those of Embodiment 1. Here, the central side of the heat sink 3c is referred to as a first portion 3c1 (Reference characters are different from those of Embodiment 2 in order to distinguish from Embodiment 1) and both end sides are referred to as second portions 3c2 (Reference characters in the example of Embodiment 2 illustrated in FIG. 3 are different in order to distinguish from Embodiment 1).

A heat sink 3c according to the embodiment includes a third surface on which the semiconductor laser array 2 is mounted and a fourth surface opposite to the third surface. In the heat sink 3c, the radiation portion of the semiconductor laser group 2a1 is in surface contact with the first portion 3c1 located in the central side and the radiation portions of the semiconductor laser group 2a2 is in surface contact with the second portions 3c2 located in both end sides. Here, in the heat sink 3c, a region which is a surface of the first portion 3c1 and is in the third surface is referred to as a fifth region, and a region which is a surface of each of the second portions 3c2 and is in the third surface is referred to as a sixth region. Moreover, the fourth surface of the first portion 3c1 and the second portions 3c2 in the heat sink 3c is in contact with the cooling unit 4.

The heat generated in the semiconductor laser group 2a1 is radiated by surface contact with the fifth region of the first portion 3c1 in the heatsink 3c, and is cooled by surface contact of the first portion 3c1 with the cooling unit 4. The heat generated in the semiconductor laser group 2a2 is radiated by surface contact with the sixth region of each of the second portions 3c2 in the heat sink 3c, and is cooled by surface contact of the second portions 3c2 with the cooling unit 4. Here, the heat sink 3c is configured with the first portion 3c1 and the second portions 3c2 whose materials are different. The material of the first portion 3c1 is lower in thermal conductivity than the material of the second portions 3c2.

In other words, the heat sink is configured so that the material of the second portions corresponding to the sixth region with which the radiation portions of the semiconductor laser group 2a2 is in contact is higher in thermal conductivity than the material of the first portion corresponding to the fifth region with which the radiation portion of the semiconductor laser group 2a1 is in contact.

According to the present embodiment, since the heat sink 3c is configured with the different materials between the central side and both end sides in the stripe width direction among the plurality of semiconductor lasers, the heat radiation efficiencies of the plurality of semiconductor lasers are non-uniform in the stripe width direction in the semiconductor laser light source 300. As a result, the wavelength width of the semiconductor laser light source 300 is widened, and therefore the speckle noise can be reduced.

Furthermore, according to the embodiment, the semiconductor laser light source can be obtained whose productivity reduction is suppressed and whose speckle noise can be reduced. In addition, because of the easy processing, it is easy to control for obtaining stable performance with respect to the manufacturing variation of the semiconductor laser array 2.

Similar to Embodiment 1, the number of semiconductor lasers constituting the semiconductor laser group 2a1 is preferable to be larger than the number of semiconductor lasers constituting the semiconductor laser group 2a2. This can improve the non-uniformity of the wavelength width distribution shape in the semiconductor laser light source 300, and therefore the speckle noise can be further reduced.

Figure 4:
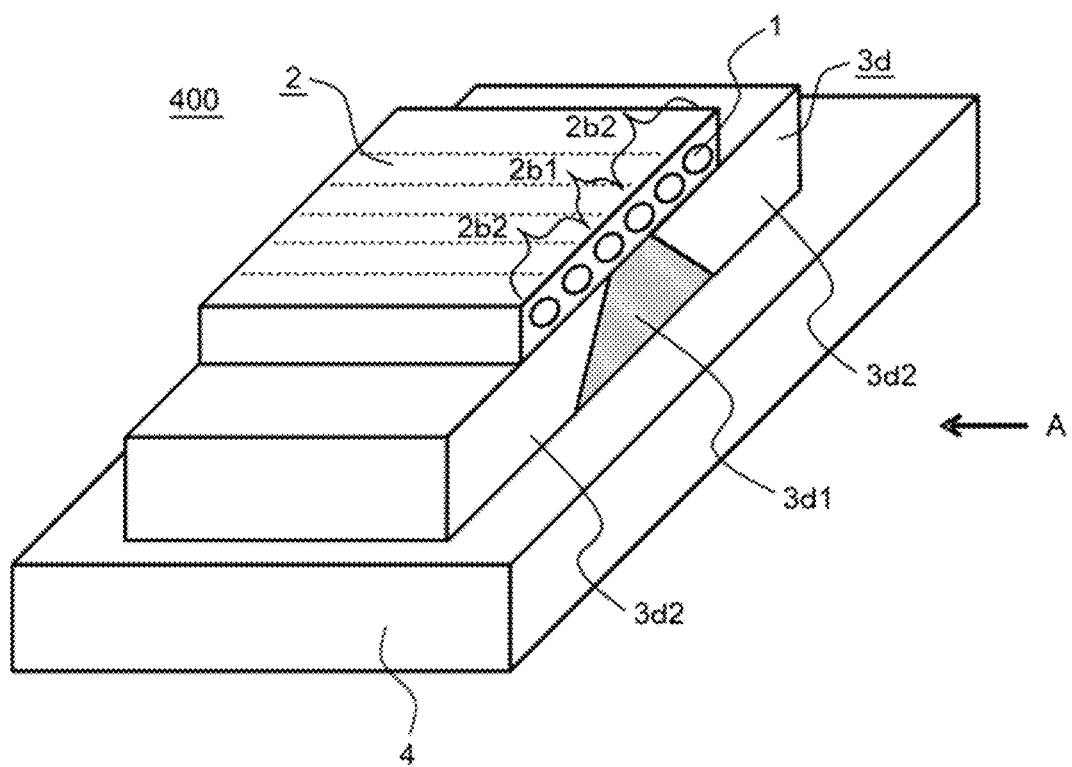
FIG. 4 is a diagram showing a structure of a first modification of the semiconductor laser light source according to Embodiment 2 of the present invention.

Note that, the shape of the heat sink 3c illustrated in FIG. 3 is an example, and therefore the shape is not limited to the shape illustrated in FIG. 3 as long as the structure is designed so that the heat radiation efficiencies of a plurality of semiconductor lasers are not constant in the stripe width direction. For example, FIG. 4 shows a semiconductor laser light source 400 as a structure of a first modification of the semiconductor laser light source 300 according to Embodiment 2 of the present invention. Here, the central side of a heat sink 3d is referred to as a first portion 3d1 (Reference characters are different from those of the other examples in order to distinguish from the other examples) and both end sides are referred to as second portions 3d2 (Reference characters are different from those of the other examples in order to distinguish from the other examples). In a cross section view along an arrow A in FIG. 4, that is, in a sectional view in the stripe length direction, the heat sink 3d includes the portion whose rate of the second portion 3d2 with respect to the first portion 3d1 in the vertical direction is gradually increased from the central side to both end sides in the stripe width direction.

Accordingly, the heat radiation efficiencies of the plurality of semiconductor lasers become non-uniform in the stripe width direction. As a result, the wavelength width of the semiconductor laser light source 400 is widened, and therefore the speckle noise can be reduced. Even in the modification, by increasing the number of semiconductor lasers constituting the semiconductor laser group 2b1 larger than the number of semiconductor lasers constituting the semiconductor laser group 2b2, the speckle noise can be similarly further reduced.

Figure 5:
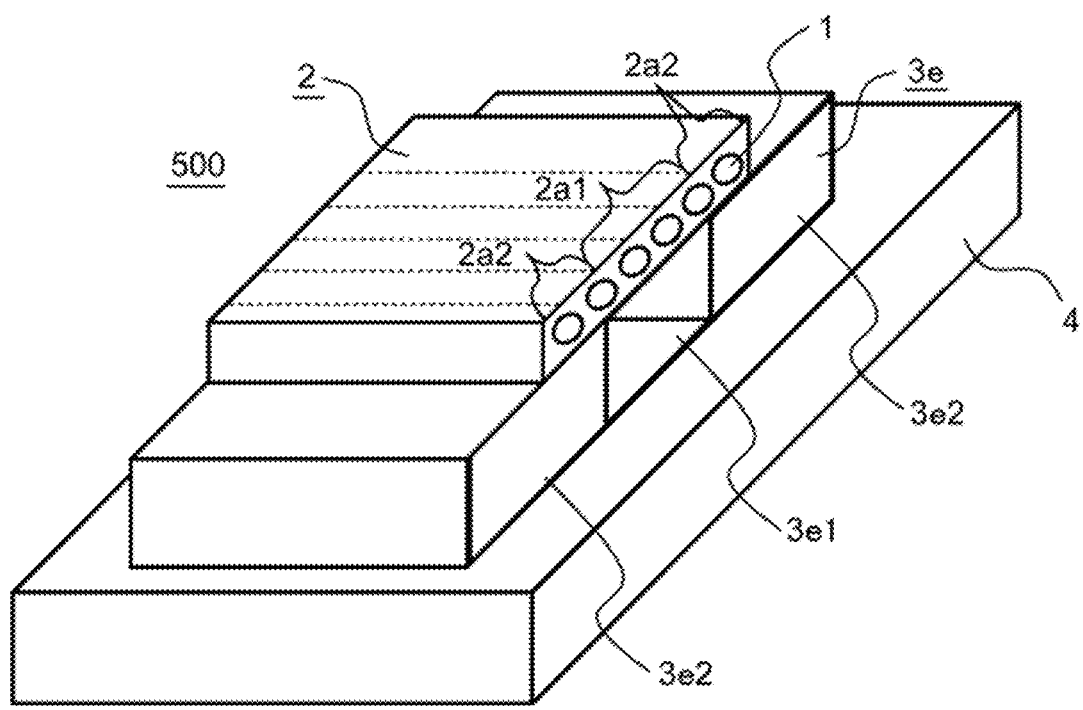
FIG. 5 is a diagram showing a structure of a second modification of the semiconductor laser light source according to Embodiment 2 of the present invention.

FIG. 5 shows a semiconductor laser light source 500 as a structure of a second modification of the semiconductor laser light source 300 according to Embodiment 2 of the present invention. Here, the central side of a heat sink 3e is referred to as a first portion 3e1 (Reference characters are different from those of the other examples in order to distinguish from the other examples) and both end sides are referred to as second portions 3e2 (Reference characters are different from those of the other examples in order to distinguish from the other examples). In the heat sink 3e according to the present embodiment, the radiation portion of the semiconductor laser group 2a1 is in surface contact with the first portion 3e1 located in the central side and the radiation portions of the semiconductor laser group 2a2 are in surface contact with the second portions 3e2 located in both end sides. Moreover the first portion 3e1 and the second portions 3e2 of the heat sink 3e are in surface contact with the cooling unit 4.

In the second modification according to the present embodiment, the first portion 3e1 in the heat sink 3e is hollow. That is, the material of the first portion 3e1 is air. Accordingly, the heat radiation efficiencies of the plurality of semiconductor lasers become non-uniform in the stripe width direction. As a result, the wavelength width of the semiconductor laser light source 500 is widened, and therefore the speckle noise can be reduced. Even in the modification, by increasing the number of semiconductor lasers constituting the semiconductor laser group 2a1 than the number of semiconductor lasers constituting the semiconductor laser group 2a2, the speckle noise can be similarly further reduced.

EXPLANATION OF REFERENCE CHARACTERS

2: semiconductor laser array; 2a1: semiconductor laser array group; 2b1: semiconductor laser array group; 3a: heat sink; 3a1: first portion; 3a2: second portion; 3b: heat sink; 3b1: first portion; 3b2: second portion; 3c: heat sink; 3c1: first portion; 3c2: second portion; 3d: heat sink; 3d1: first portion; 3d2: second portion; 3e: heat sink; 3e1: first portion 3e2: second portion; 100: semiconductor laser light source; 200: semiconductor laser light source; 300: semiconductor laser light source; 400: semiconductor laser light source; 500: semiconductor laser light source

The invention claimed is:

1. A semiconductor laser light source comprising:
a semiconductor laser array in which a plurality of semiconductor lasers are provided and stripes of the plurality of semiconductor lasers are arrayed at equal intervals in a stripe width direction; and
a heat sink having a first surface on which the semiconductor laser array is mounted, and a second surface opposite to the first surface and in contact with a cooling unit,
wherein a surface area of a second region in the second surface opposite to a first region in the first surface with which a semiconductor laser radiation portion in a central side of the plurality of semiconductor lasers in the stripe width direction is in contact, is smaller than a surface area of a fourth region in the second surface opposite to a third region in the first surface with which a semiconductor laser radiation portion except for lasers in the central side of the plurality of semiconductor lasers in the stripe width direction is in contact, when each of the areas is converted into an area per semiconductor laser,
wherein both the second region and the fourth region in the second surface are in contact with said cooler, and the difference in surface areas between the second region and the fourth region increases a non-uniformity in heat radiation efficiencies of the plurality of semiconductor lasers, and
wherein, in the heat sink, the area of the fourth region per semiconductor laser is gradually increased from the central side to both end sides in the stripe width direction.

2. The semiconductor laser light source according to claim 1, wherein the number of semiconductor lasers in the central side of the plurality of semiconductor lasers is larger than the number of semiconductor lasers except for the central side.

* * * * *